(12) United States Patent
Aramaki et al.

(10) Patent No.: US 9,418,817 B2
(45) Date of Patent: Aug. 16, 2016

(54) FOCUSED ION BEAM APPARATUS AND CONTROL METHOD THEREOF

(71) Applicant: HITACHI HIGH-TECH SCIENCE CORPORATION, Minato-ku, Tokyo (JP)

(72) Inventors: Fumio Aramaki, Tokyo (JP); Yasuhiko Sugiyama, Tokyo (JP); Hiroshi Oba, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 157 days.

(21) Appl. No.: 14/218,020

(22) Filed: Mar. 18, 2014

(65) Prior Publication Data

US 2014/0292189 A1     Oct. 2, 2014

(30) Foreign Application Priority Data

Mar. 27, 2013   (JP) .................................. 2013-066221

(51) Int. Cl.
*H01J 37/08*   (2006.01)
(52) U.S. Cl.
CPC ........... *H01J 37/08* (2013.01); *H01J 2237/002* (2013.01); *H01J 2237/0807* (2013.01)
(58) Field of Classification Search
None
See application file for complete search history.

(56) References Cited

U.S. PATENT DOCUMENTS

| | | | | | |
|---|---|---|---|---|---|
| 5,223,109 | A | * | 6/1993 | Itoh ...................... | H01J 37/3056 204/192.34 |
| 5,849,093 | A | * | 12/1998 | Andra ..................... | B01J 19/081 134/1 |
| 7,241,361 | B2 | * | 7/2007 | Keller ..................... | H01J 27/16 156/345.48 |
| 8,735,964 | B2 | * | 5/2014 | Ferrus ............... | H01L 21/28273 257/314 |
| 8,785,883 | B2 | * | 7/2014 | Nakazawa ......... | G01N 23/2251 250/306 |
| 8,822,913 | B2 | * | 9/2014 | Graupera ................ | H01J 37/05 118/723 R |
| 8,835,884 | B2 | * | 9/2014 | Arai ....................... | H01J 37/06 250/307 |

(Continued)

FOREIGN PATENT DOCUMENTS

| | | |
|---|---|---|
| JP | 2003328261 | 11/2003 |
| JP | 2009517840 | 4/2009 |
| WO | 2007067313 | 6/2007 |

*Primary Examiner* — Douglas W Owens
*Assistant Examiner* — Srinivas Sathiraju
(74) *Attorney, Agent, or Firm* — Adams & Wilks (57) ABSTRACT

A focused ion beam apparatus has an emitter for emitting an ion beam, an ion source chamber accommodating the emitter, a cooling unit and a heating unit for cooling and heating, respectively, the emitter, and an ion source gas supply section for supplying to the ion source chamber an ion source gas that is exchangeable with another ion source gas. A control section controls an operation of the cooling unit such that a temperature of a wall surface contacting the ion source gas in the ion source chamber is maintained at a temperature higher than a temperature at which the ion source gas before and after the exchange freezes. The control section controls an operation of the heater so that the emitter is temporarily heated to release the ion source gas from a surface of the emitter before the ion source gas is exchanged with the other ion source gas.

17 Claims, 3 Drawing Sheets

(56) References Cited

U.S. PATENT DOCUMENTS

| | | | | |
|---|---|---|---|---|
| 8,847,173 B2* | 9/2014 | Kawanami | | H01J 37/08 250/423 F |
| 8,981,315 B2* | 3/2015 | Muto | | H01J 37/08 250/221 |
| 9,087,671 B2* | 7/2015 | Graupera | | H01J 37/05 |
| 9,087,675 B2* | 7/2015 | Kawanami | | H01J 37/08 |
| 9,159,534 B2* | 10/2015 | Graupera | | H01J 37/08 |
| 2001/0033012 A1* | 10/2001 | Kommerling | | G06F 21/86 257/679 |
| 2005/0072753 A1 | 4/2005 | Koops et al. | | 216/2 |
| 2010/0044580 A1* | 2/2010 | Boswell | | H01J 27/024 250/424 |
| 2013/0126731 A1* | 5/2013 | Shichi | | H01J 37/08 250/310 |
| 2014/0306607 A1* | 10/2014 | Graupera | | H01J 37/08 315/111.31 |

* cited by examiner

FOCUSED ION BEAM APPARATUS AND CONTROL METHOD THEREOF

This application claims priority from Japanese Patent Application No. 2013-066221 filed on Mar. 27, 2013, the entire subject-matter of which is incorporated herein by reference.

BACKGROUND

1. Technical Field

The disclosure relates to a focused ion beam apparatus provided with a gas electric field ionization ion source (GFIS) and a control method thereof.

2. Description of Related Art

In the related art, as a device that observes an image at high resolution, a scanning electron microscope (SEM) using an electron beam is widely known. Further, in recent years, a scanning electron microscope using helium ions emitted from a gas electric field ionization ion source (GFIS) has also been in practical use.

As a device that machines a random position, a machining device using gallium ions emitted from a liquid metal ion source (LIMS) is widely known. This device is used for cross-section observation of an arbitrary location of a sample, manufacturing of a TEM sample, wiring change of a semiconductor, pattern modification of a semiconductor lithography mask or the like. Further, in recent years, a machining device using an electron beam has been in practical use for the modification of the mask mentioned above.

As a device that machines an arbitrary position of a sample, a micromachining technique using gallium ions is widely used as a general technique, but a micromachining technique using electrons or helium ions is yet considered as a special technique. As the micromachining technique using electrons or helium ions, for example, techniques disclosed in JP-A-2003-328261 and JP-T-2009-517840 are in practical use.

In the machining technique using the gallium ion beam, any materials can be etched by a sputtering effect, but damage to a sample from gallium injection is serious.

On the other hand, in the case of the machining technique using the electron beam or the helium ion beam, damage to a sample is slight, but since it is necessary to use a gas having an etching promotion function, it is difficult to perform machining in a case where an appropriate gas is not present.

In the case of the GFIS machining technique that has been in practical use in recent years, it is possible to exchange ion species by the same device. Thus, in a case where the mass of the ion species is large, it is possible to achieve a machining characteristic close to the machining technique using the gallium ion beam; whereas in a case where the mass of the ion species is small, it is possible to achieve a machining characteristic close to the machining technique using the electron beam. Which ion mass is used is determined based on a desired machining characteristic.

When a machining device is actually used, there is a case where it is necessary to use both of ions having a large mass and ions having a small mass. First of all, there is a case where several kinds of samples are present and ion species suitable for the samples are different from each other. Further, there is a case where one ion species is suitable for machining while the other ion species is suitable for observation, that is, a case where machining performance and image resolving power are not compatible using a single ion species.

In such a case, the ion species is exchanged to cope therewith.

As a method of exchanging the ion species, in addition to exchanging of a source gas to be supplied to the ion source chamber, the following methods may be considered, a method of exchanging an emitted ion species by supplying plural source gases into an ion source chamber at the same time and exchanging an extraction voltage, or a method of extracting only a desired ion species using an E×B (secondary electron detector) from ion species emitted at the same time.

In the former method (i.e., exchanging an emitted ion species), in a case where electric field intensities that ionize gases to be used are close to each other, there is provided a beam in which plural ion species are constantly mixed. Thus, when it is necessary to perform machining using ion species having a small mass, ion species having a large mass may be mixed, and in this case, damage to a sample becomes serious.

In the latter method (i.e., extracting only a desired ion species), a beam of a single ion species is obtained, but an ion optical system is complicated and enlarged, and a beam diameter may not be narrowed down.

That is, according to the both above-mentioned methods, since it is difficult to prevent performance deterioration, the method of exchanging the source gas to be supplied to the ion source chamber is considered again. However, in this case, if the gas before exchange remains in the ion source chamber, the gas is mixed into a beam after exchange. Thus, in this method, it is necessary to wait until the purity of the gas after exchange increases, which causes a problem that an ion species exchange time becomes long.

SUMMARY

Illustrative aspects of the invention provide a focused ion beam apparatus capable of exchanging ion species in a short time without allowing a gas before exchange to remain in an ion source chamber, and a control method thereof.

According to one illustrative aspect of the invention, there may be provided a focused ion beam apparatus comprising: an emitter configured to emit an ion beam; an ion source chamber that accommodates the emitter and is supplied with a source gas; a cooling unit configured to cool the ion source chamber; and a control section configured to control the entire apparatus, wherein the control section comprises a temperature control section configured to control an operation of the cooling unit such that a temperature of a wall surface contacting the source gas in the ion source chamber is maintained at a temperature higher than a temperature at which the source gas freezes.

According to another illustrative aspect of the invention, there may be provided a method of controlling a focused ion beam apparatus comprising an emitter configured to emit an ion beam, an ion source chamber that accommodates the emitter and is supplied with a source gas, a cooling unit configured to cool the ion source chamber and a control section configured to control the entire device, the method comprising: a temperature maintaining process of controlling an operation of the cooling unit such that a temperature of a wall surface contacting the source gas in the ion source chamber is maintained at a temperature higher than a temperature at which the source gas freezes.

According to still another illustrative aspect of the invention, there may be provided a focused ion beam apparatus comprising: an emitter configured to emit an ion beam; an ion source chamber that accommodates the emitter and is supplied with a source gas; a heater configured to heat the emitter; and a control section configured to control the entire apparatus, wherein the control section comprises a temperature control section configured to control an operation of the heater so that the emitter is temporarily heated when the source gas is exchanged.

According to still another illustrative aspect of the invention, there may be provided a method of controlling a focused ion beam apparatus comprising an emitter configured to emit an ion beam, an ion source chamber that accommodates the emitter and is supplied with a source gas, a heater configured to heat the emitter and a control section configured to control the entire device, the method comprising: a temporally heating process of controlling an operation of the heater such that the emitter is temporarily heated when the source gas is exchanged.

According to the illustrative aspects of the invention, it is possible to provide a focused ion beam apparatus capable of exchanging ion species in a short time without allowing a gas before exchange to remain in an ion source chamber, and a control method thereof.

DETAILED DESCRIPTION

Hereinafter, illustrative embodiments of the invention will be described with reference to the accompanying drawings.

First Illustrative Embodiment

Figure 1:
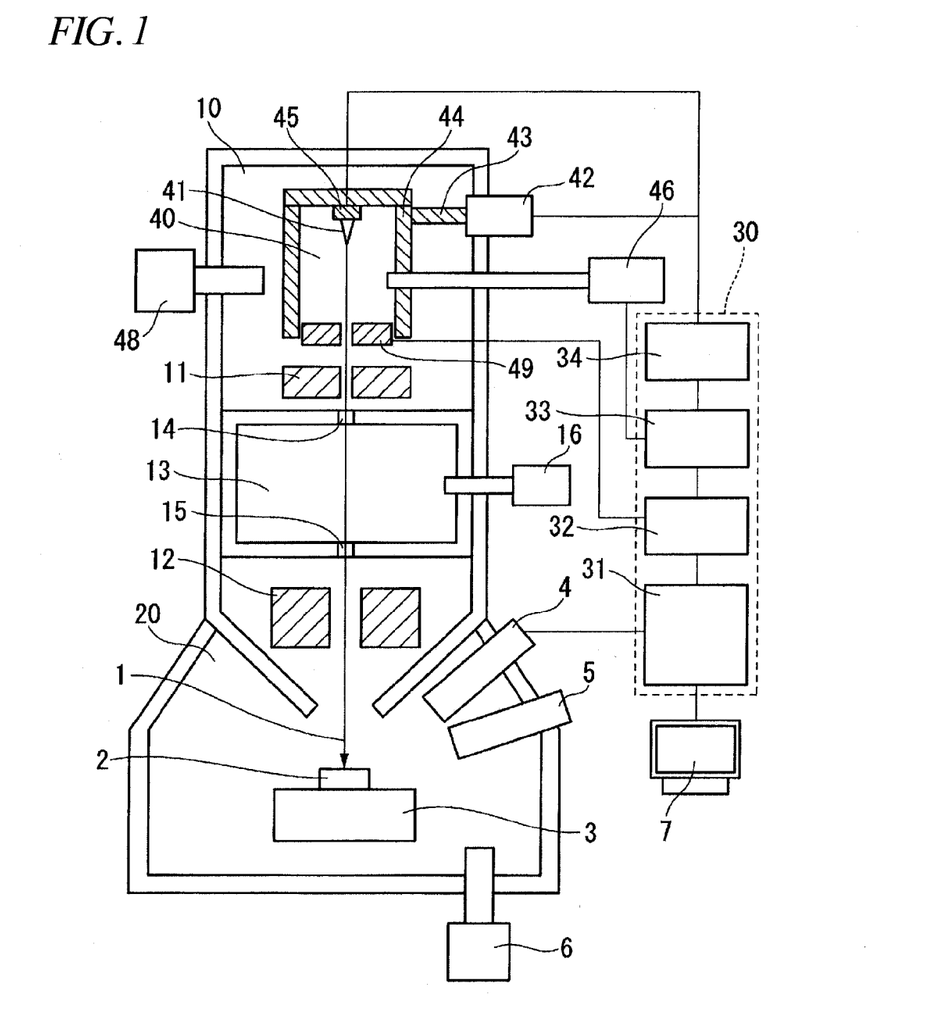
FIG. 1 is a configuration diagram of a focused ion beam apparatus according to an illustrative embodiment of the invention.

FIG. 1 shows a focused ion beam apparatus provided with a gas electric field ionization ion source according to an illustrative embodiment of the invention. The gas electric field ionization ion source forms a high electric field around a tip of an emitter 41 sharpened at an atomic level in an ion source chamber 40 in which an ion source gas is supplied to ionize the ion source gas adsorbed to the tip, and emits an ion beam 1. Since the ion beam 1 emitted from the tip of the emitter 41 has a fine light source diameter of several angstroms, it is possible to irradiate a sample 2 with the ion beam 1 having a small beam diameter and a high luminance.

In order to machine the sample 2 by the ion beam 1, the focused ion beam apparatus emits the ion beam 1, using nitrogen with a high sputtering effect, instead of a light element such as helium. On the other hand, in order to obtain an observation image by the scanning irradiation of the ion beam 1, the focused ion beam apparatus may also emit the ion beam 1 using the light element such as a helium. However, in an operation in which both of ion species having a large mass and ion species having a small mass are used, when electric field intensities that ionize gases to be used are close to each other if the ion species having the large mass is mixed in a machining process using the ion species having the small mass, the sample 2 may be damaged.

For this reason, it is necessary to provide a technique that increases the purity of the gas after exchange. However, with the simple waiting until the purity of the gas after exchange increases after the gas is exchanged, it takes a long time for the ion species exchange. Particularly, when a surface temperature of each section contacting the source gas in the ion source chamber 40 (hereinafter, referred to as a wall surface temperature in the ion source chamber 40) is low and the source gas contacting the surface freezes (solidified), the solidified gas serves as a supply source, and thus, the source gas before the gas exchange is continuously emitted after the gas exchange to deteriorate the purity of the gas after exchange (the gas before exchange is ionized).

Accordingly, the focused ion beam apparatus of the present illustrative embodiment is provided to maintain the wall surface temperature in the ion source chamber 40 at a temperature at which the source gas is not solidified, to reduce the adsorption amount of the gas before exchange to the surface, to increase the purity of the gas after exchange, and to reduce the ion species exchange time.

The focused ion beam apparatus includes an ion beam lens tube 10, a sample chamber 20, and a control section 30.

The sample chamber 20 accommodates a sample stage 3 that moves the sample 2 to an irradiation position of the ion beam 1 emitted from the ion beam lens tube 10.

The sample stage 3 may be operated based on an instruction of an operator to be displaced on five axes. That is, the sample stage 3 is supported by a displacement mechanism that includes an XYZ axis mechanism that moves the sample stage 3 along an X axis and a Y axis that are orthogonal to each other in the same plane and along a Z axis orthogonal to the X and Y axes, a tilt axis mechanism that rotates the sample stage 3 around the X axis or the Y axis to be inclined, and a rotation mechanism that rotates the sample stage 3 around the Z axis.

The sample chamber 20 includes a detector 4 that detects a secondary ion or a secondary electron generated by the scanning irradiation of the ion beam 1. It is possible to form an observation image from a detection signal of the detector 4 and a scanning signal of the ion beam 1. When a reflected ion detector is used as the detector 4, it is possible to detect the reflected ion generated from the sample 2 to form a reflected ion image.

The sample chamber 20 includes a gas supply section 5 capable of applying a gas to the sample 2 during irradiation of the ion beam 1. The gas supply section 5 includes a gas storing section that stores a gas and a nozzle section that supplies the gas around the sample 2. The gas supply section 5 may be provided with a gas flow rate adjusting section that adjusts the flow rate of the gas, such as a mass flow controller.

The sample chamber 20 includes a vacuum pump 6 for evacuating the inside of the chamber. It is possible to adjust the degree of vacuum in the sample chamber 20 by the vacuum pump 6.

The control section 30 includes an image forming section 31 that forms an observation image from the detection signal from the detector 4. The observation image formed in the image forming section 31 is displayed in a display section 7. Accordingly, by irradiating the sample 2 with the ion beam 1 and detecting the generated secondary ion or secondary electron, it is possible to display the observation image of the sample 2 in the display section 7 for observation.

The ion beam lens tube 10 includes a condenser lens electrode 11 that condenses the ion beam 1 emitted from the ion source chamber 40 and an objective lens electrode 12 that focuses the ion beam 1 on the sample 2. An intermediate chamber 13 is provided between the ion source chamber 40 and the sample chamber 20. The intermediate chamber 13 is provided with an orifice 14 between the ion source chamber 40 and the intermediate chamber 13 and an orifice 15 between the sample chamber 20 and the intermediate chamber 13. The ion beam 1 passes through orifices 14 and 15 and irradiates the sample 2. Further, the intermediate chamber 13 is provided with the vacuum pump 16, to adjust the degree of vacuum inside the intermediate chamber 13. The intermediate chamber 13 can perform differential evacuation between the sample chamber 20 and the ion source chamber 40.

The ion source chamber 40 is provided with the emitter 41 that emits the ion beam 1, a cooling unit 42 that cools the emitter 41, an ion source gas supply section 46 that supplies an ion source gas to the emitter 41, and a vacuum pump 48 that evacuates the ion source chamber 40. The emitter 41 is cooled by the cooling unit 42 through a connecting section 43 that connects the cooling unit 42 and the ion source chamber 40 and a wall portion 44 of the ion source chamber 40. A heater 45 is connected to the emitter 41, to adjust the temperature of the emitter 41. The cooling unit 42 and the heater 45 are controlled by a temperature control section 34 of the control section 30.

An inner space of the ion source chamber 40 is connected to an inner space of the ion beam lens tube 10 through a hole or the like provided in the wall portion 44. The vacuum pump 48 evacuates the inside of the ion source chamber 40 and the inside of the ion beam lens tube 10. The degree of vacuum inside the ion source chamber 40 and the ion beam lens tube 10 is maintained at about $10^{-4}$ Pa to about $10^{-6}$ Pa during the system is operated.

The cooling unit 42 is a device that cools the emitter 41 by a coolant such as liquid nitrogen or liquid helium accommodated inside the cooling unit 42. As the cooling unit 42, a closed cyclic freezer of a GM type, a pulse tube type or the like, or a gas flow type freezer may be used.

The emitter 41 is formed of tungsten, molybdenum or the like. The emitter 41 may be formed by coating a needle-like base material formed of tungsten, molybdenum or the like with a precious metal such as platinum (Pt), palladium (Pd), iridium (Ir), rhodium (Rh) or gold (Au). The tip of the emitter 41 is sharpened in a pyramid shape at an atomic level.

The tip of the emitter 41 has an extremely sharp shape, and a nitrogen ion is emitted from the tip. Since an energy distribution width of the ion beam 1 is extremely thin, it is possible to suppress the influence of chromatic aberration. Thus, for example, compared with a plasma type gas ion source or a liquid metal ion source, it is possible to obtain the ion beam 1 with an extremely small bead diameter and high luminance.

Further, the ion source chamber 40 is provided with an extraction electrode 49 that forms an electric field for extracting the ion beam 1 around the emitter 41. Voltage applied to the extraction electrode 49 is controlled by an extraction voltage control section 32 of the control section 30.

The ion source chamber 40 is provided with the ion source gas supply section 46 that supplies the ion source gas. The ion source gas supply section 46 includes a gas storing section that stores the ion source gas and a nozzle section that supplies the ion source gas around the emitter 41. The ion source gas supply section 46 includes a gas flow rate adjusting section that adjusts the flow rate of the ion source gas, such as a mass flow controller. The ion source gas supply section 46 is controlled by an ion source gas control section 33 of the control section 30.

Figure 2:
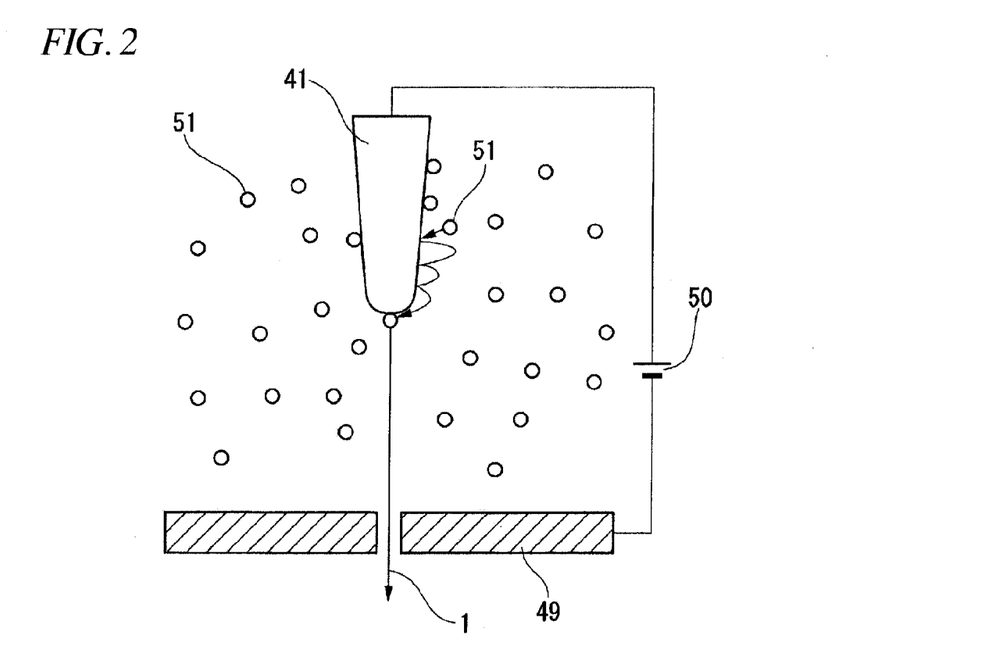
FIG. 2 is a diagram illustrating an ion beam irradiation principle according to an illustrative embodiment of the invention.

Next, an ion beam irradiation principle will be described with reference to FIG. 2.

The ion source chamber 40 is supplied with a nitrogen gas from the ion source gas supply section 46, and thus, nitrogen molecules 51 are present around the emitter 41. The emitter 41 is cooled by the cooling unit 42, and adsorbs the nitrogen molecules 51 around the emitter 41. A power source 50 applies a voltage between the emitter 41 and the extraction electrode 49 by a signal from the extraction voltage control section 32. Thus, a high electric filed is generated around the tip of the emitter 41, and the nitrogen molecules 51 adsorbed to the emitter 41 move to the tip. The nitrogen molecules 51 are ionized at the tip of the emitter 41, and the ion beam 1 is emitted by the extraction voltage.

The tip of the emitter 41 is sharpened at an atomic level, and is formed so that a crystal structure has a pyramid shape. Accordingly, in a case where the voltage is applied between the emitter 41 and the extraction electrode 49, a very large electric field is formed at the tip of the pyramid, and the nitrogen molecules 51 are polarized to be pulled toward the tip. Further, the pulled nitrogen molecules 51 are ionized at a high electric field position. The nitrogen ion is emitted toward the inside of the sample chamber 20 through an opening portion of the extraction electrode 49. Since the size of an emission area of the ion beam 1, that is, a source size of the ion source is extremely small, it is possible to perform irradiation of the ion beam 1 having a small beam diameter on the sample 2 and high luminance.

The electric field necessary for ionizing the ion source gas is different according to the species of gases. In the case of helium, the electric field is $4.40 \times 10^{10}$ V/M. In the case of nitrogen, the electric field is $1.65 \times 10^{10}$ V/M, which is smaller than that of the helium. That is, since the nitrogen can be ionized with a small electric field compared with the helium, the applied voltage is smaller than that of the helium, which is preferable. If the applied voltage is large, the emitter 41 is quickly exhausted due to its field evaporation. For this reason, by using nitrogen, it is possible to prolong the life of the emitter 41. The applied voltage capable of emitting the ion beam 1 may be changed in the shape of the tip of the emitter 41. In the present illustrative embodiment, it is possible to emit the ion beam 1 using the applied voltage of 0.5 kV to 20 kV.

The intermediate chamber 13 is provided with the orifice 14 between the ion source chamber 40 and the intermediate chamber 13 and the orifice 15 between the sample chamber 20 and the intermediate chamber 13 and is provided with the vacuum pump 16, to maintain the degree of vacuum different from those of the sample chamber 20 and the ion source chamber 40. A basic degree of vacuum of the sample chamber 20 has an order of $1.0 \times 10^{-5}$ Pa. Further, when the machining is performed while applying the gas to the sample 2 by the gas supply section 5, the degree of vacuum of the sample chamber 20 has an order of $1.0 \times 10^{-3}$ Pa. In the latter case, the operation is performed in a state where the degree of vacuum of the ion source chamber 40 is higher than that of the sample chamber 20. Thus, if the intermediate chamber 13 is not present, an impurity gas is flowed into the ion source chamber 40 from the sample chamber 20 and is adsorbed to the emitter 41, which causes unstable ion beam irradiation.

Next, a temperature control of the focused ion beam apparatus of the present illustrative embodiment will be described.

In a case where the temperature of the emitter 41 is low, the adsorption density of the nitrogen molecules increases. Accordingly, by decreasing the temperature of the emitter 41, it is possible to increase the intensity of current of the ion beam 1. However, when the temperature of the emitter 41 decreases, the temperature of the cooling unit 42, the wall portion 44 of the ion source chamber 40 or the connecting section 43 of the cooling unit 42 and the ion source chamber 40 decreases, and consequently, the nitrogen gas is adsorbed to the wall portion 44 or the connecting section 43, and freezes and solidified.

If the nitrogen is solidified on the wall portion 44 or the connecting section 43, the solidified nitrogen serves as a gas supply source even after the source gas is exchanged. For example, a sample photo mask is machined by an ion beam that uses a nitrogen gas as a source gas. Then, when an EUVL mask that is easily affected by irradiation damage, compared with the photo mask, is machined by an ion beam that uses a hydrogen gas having a small mass as a source gas, if the nitrogen gas is exchanged to the hydrogen gas, an electric field intensity for ionizing hydrogen is close to an electric field intensity for ionizing nitrogen, and thus, the nitrogen is also ionized as the hydrogen is ionized. Thus, the nitrogen ion having a large mass is mixed into the hydrogen ion, which causes damage to the EUVL mask.

Figure 3:
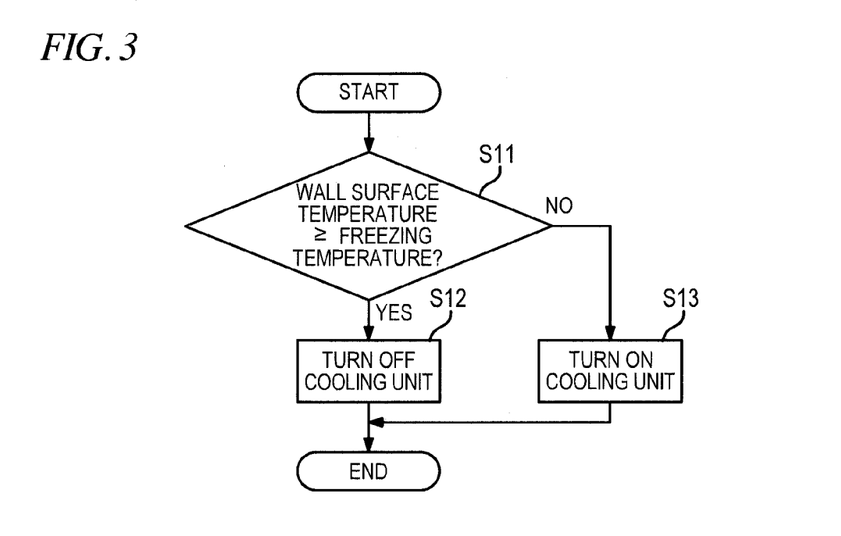
FIG. 3 is a flowchart illustrating a first illustrative embodiment of a process of a control section of the focused ion beam apparatus.

Thus, in the present illustrative embodiment, as shown in FIG. 3, by controlling the operation of the cooling unit 42 by the temperature control section 34, the temperature of the wall surface in the ion source chamber 40 is maintained at a temperature that exceeds a temperature at which each of the source gases before and after the exchange freezes. Particularly, the temperature of the wall surface is maintained at a temperature exceeding the temperature at which a source gas having a large mass freezes. When the source gases before and after exchange are the nitrogen gas and the hydrogen gas, since the temperature at which the nitrogen gas freezes is higher than the temperature at which the hydrogen gas freezes, the temperature exceeding these temperatures becomes a temperature (for example, a temperature of 60K around a triple point of the nitrogen gas) exceeding the temperature (30K to 40K) at which the nitrogen gas freezes with the degree of vacuum. In the present illustrative embodiment, the "temperature that exceeds the temperature at which the source gas freezes" is a temperature in the range from the temperature (30K to 40K) at which the source gas freezes to an upper limit temperature (100K) at which an emission current necessary for forming an observation image can be obtained. The temperature of the wall surface is controlled to be constantly maintained at a predetermined temperature in this range. Particularly, the temperature around the cooling unit 42 or the connecting section 43 where gases are easily frozen is controlled to be constantly maintained at a predetermined temperature in the range.

As shown in FIG. 3, first, in step S11, the temperature control section 34 determines whether the temperature of the wall surface is equal to or higher than the temperature exceeding the temperature (hereinafter, referred to as a freezing temperature) at which each of the source gases before and after exchange freezes. In a case where the determination is YES (in a case where the temperature of the wall surface is equal to or higher than the freezing temperature), in step S12, the cooling unit 42 is turned off, and the process is finished; whereas in a case where the determination is NO (in a case where the temperature of the wall surface is lower than the freezing temperature), in step S13, the cooling unit 42 is turned on, and the process is finished.

Using such a temperature maintaining process, it is possible to suppress adsorption of the gas before exchange to the wall surface, and to increase the purity of the gas after exchange.

As described above, according to the present illustrative embodiment, by controlling the operation of the cooling unit 42 to maintain the temperature of the wall surface contacting the source gas in the ion source chamber 40 at the temperature higher than the temperature at which the source gas freezes, it is possible to maintain the temperature of the wall surface in the ion source chamber 40 at the temperature at which the source gas is not solidified, and to reduce the amount of adsorption of the source gas to the wall surface of the ion source chamber 40. Thus, compared with a case where the waiting is necessary until the gas purity after exchange increases, it is possible to increase the purity of the gas after exchange in a short operation time. Accordingly, by using two species of source gases that are close to each other in electric field intensities for ionization and have different masses, even when a source gas having a large mass is exchanged to a source gas having a small mass, it is possible to suppress the source gas before exchange from being mixed into the source gas after exchange, and to perform the machining while suppressing the damage to the sample 2.

The wall surface contacting a space (including a space evacuated by the vacuum pump 48, that is, the inside of the ion beam lens tube 10) considered as the same space as the inside of the ion source chamber 40 is maintained at a predetermined temperature or higher by controlling the cooling unit 42 by the temperature control section 34. As this temperature increases, a possibility that the source gas is solidified on the wall surface decreases. However, if the temperature of the emitter 41 increases due to the temperature of the wall surface, the emission current decreases, and thus, the temperature should not be excessively high. Accordingly, in consideration of the balance of the ion species exchange time and the emission current, the temperature of the wall surface is adjusted. Specifically, the temperature of the wall surface in the ion source chamber 40 and the temperature of the surface of the connecting section 43 are maintained at least at a temperature slightly higher than the highest temperature in a temperature range where the source gas to be used freezes. Thus, any source gas is not solidified. Since a portion contacting the outside air, such as a wall or the like of the ion beam lens tube 10, is at a room temperature, it is not necessary to control the temperature.

Second Illustrative Embodiment

Next, a second illustrative embodiment of the invention will be described.

This illustrative embodiment is different from the first illustrative embodiment in that the wall surface temperature is not maintained at the predetermined temperature and the emitter 41 is heated during gas exchange. Further, the same reference numerals are given to the same components as in the first illustrative embodiment, and the redundant detailed description will not be repeated.

Figure 4:
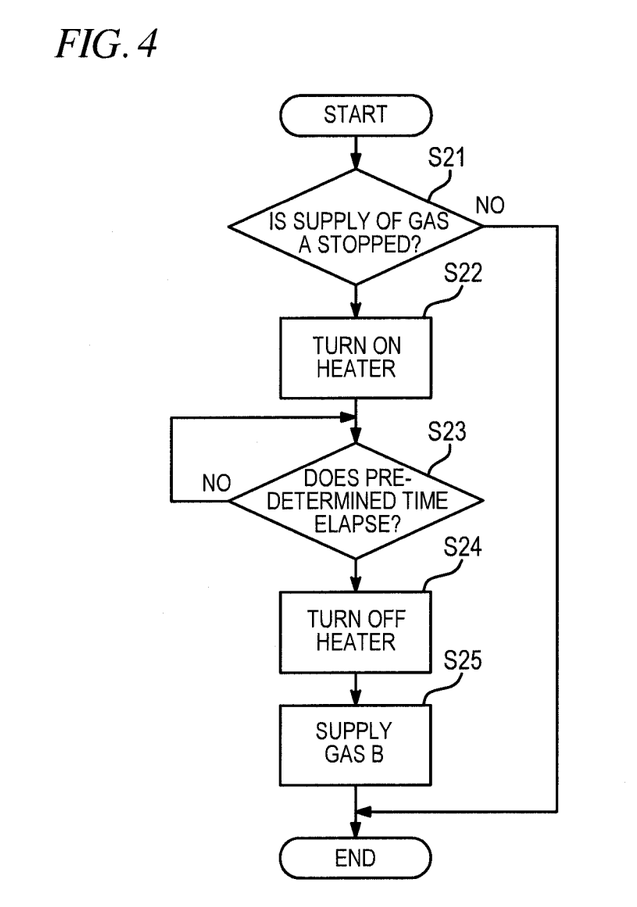
FIG. 4 is a flowchart illustrating a second illustrative embodiment of the process of the control section of the focused ion beam apparatus.

As shown in FIG. 4, when the source gas is exchanged based on an instruction of an operator, first, in step S21, the control section 30 determines whether supply of a gas A before exchange to the ion source chamber 40 is stopped. In a case where the determination is YES (in a case where the supply of the gas A is stopped), in step S22, the heater 45 is turned on; whereas in a case where the determination is NO (in a case where the supply of gas A is continued), the process is finished. The ion source chamber 40 is constantly maintained at a predetermined degree of vacuum by the vacuum pump 48, and the gas A in the ion source chamber 40 is also exhausted by the vacuum pump 48.

After the heater 45 is turned on in step S22, a predetermined time elapses in step S23, and thus, the emitter 41 is heated up to a setting temperature, in which the setting temperature is a temperature that is higher than the temperature (30K to 40K) at which the source gas freezes and is lower than a facet temperature (700K to 1000K) of the tip of the emitter 41. Further, in order to cool the emitter 41 in a short time after heating, the setting temperature is preferably a temperature lower than 200K. Thus, the emitter 41 is heated up to the setting temperature, the gas A before exchange adsorbed to the emitter 41 is released.

Then, in step S24, the heater 45 is turned off, and then, in step S25, a gas B that is an exchange gas is supplied. Then, the process is finished.

By such a temporary heating process, it is possible to suppress adsorption of the gas to the emitter 41 before the exchange gas is supplied, and to effectively increase the purity of the gas after exchange.

The emitter 41 has a small thermal capacity and a high thermal conductivity by the setting of the shape and material thereof, and returns to a predetermined operation temperature while the ion source chamber 40 is filled with the supplied gas B.

As described above, according to the present illustrative embodiment, by controlling the operation of the heater 45 to temporarily heat the emitter 41 during exchange of the source gas, it is possible to release the gas from the surface of the emitter 41 before the source gas exchange, and to increase the purity of the gas after the exchange in the vicinity of an emission point. That is, it is possible to effectively increase the purity of the gas after the exchange, as compared with a case where the gas before exchange is released from the wall surface in the ion source chamber 40.

After exchange of the source gas to be supplied to the ion source chamber 40 by the ion source gas supply section 46, when the emitter 41 is heated in a short time by controlling the heater 45 by the temperature control section 34, it is possible to increase the effect of releasing the gas adsorbed to the surface of the emitter 41 as the emitter is strongly heated, and to reduce the time necessary for increasing the gas after exchange up to a desired purity. However, if the time when the emitter 41 returns to the predetermined operation temperature becomes long, the emission current is changed during the time, and thus, it may be difficult to start high accurate machining. In consideration of this problem, the heating strength of the emitter 41 is adjusted to decrease the ion species exchange time in total. Further, in order to reduce the time necessary for reaching the high temperature, the thermal capacity of the emitter 41 is reduced and the thermal conductivity thereof is increased.

The invention is not limited to the above-described illustrative embodiments. For example, a combination of the configurations and controls of the first and second illustrative embodiments may be used.

Further, the configurations of the illustrative embodiments are only examples of the invention, and various modifications may be made in a range without departing from the spirit of the invention.

What is claimed is:

1. A focused ion beam apparatus comprising:
   an emitter configured to emit an ion beam;
   an ion source chamber that accommodates the emitter and is supplied with a source gas;
   a cooling unit, which is connected to the ion source chamber by a connecting section, and which is configured to cool the emitter by cooling the connecting section and a wall portion of the ion source chamber;
   an ion source gas supply section configured to supply an ion source gas to the ion source chamber, the ion source gas that is supplied to the ion source chamber being exchangeable with another ion source gas that is supplied by the ion source gas supply section; and
   a control section configured to control operation of the focused ion beam apparatus;
   wherein the control section comprises a temperature control section configured to control an operation of the cooling unit such that a temperature of a wall surface contacting the ion source gas in the ion source chamber is maintained at a temperature higher than a temperature at which each of the ion source gases before and after the exchange freezes.

2. A method of controlling a focused ion beam apparatus comprising an emitter configured to emit an ion beam, an ion source chamber that accommodates the emitter and is supplied with a source gas, a cooling unit configured to cool the ion source chamber, an ion source gas supply section configured to supply to the ion source chamber an ion source gas that is exchangeable with another ion source gas that is supplied by the ion source gas supply section, and a control section configured to control operation of the focused ion beam apparatus, the method comprising:
   a temperature maintaining process of controlling an operation of the cooling unit by the control section such that a temperature of a wall surface contacting the ion source gas in the ion source chamber is maintained at a temperature higher than a temperature at which each of the ion source gases before and after the exchange freezes.

3. A focused ion beam apparatus comprising:
   an emitter configured to emit an ion beam;
   an ion source chamber that accommodates the emitter and is supplied with a source gas;
   a heater configured to heat the emitter;
   an ion source gas supply section configured to supply an ion source gas to the ion source chamber, the ion source gas that is supplied to the ion source chamber being exchangeable with another ion source gas that is supplied by the ion source gas supply section; and
   a control section configured to control operation of the focused ion beam apparatus;
   wherein the control section comprises a temperature control section configured to control an operation of the heater so that the emitter is temporarily heated to release the ion source gas from a surface of the emitter before the ion source gas is exchanged with the another ion source gas.

4. A method of controlling a focused ion beam apparatus comprising an emitter configured to emit an ion beam, an ion source chamber that accommodates the emitter and is supplied with a source gas, a heater configured to heat the emitter, an ion source gas supply section configured to supply to the ion source chamber an ion source gas that is exchangeable with another ion source gas that is supplied by the ion source gas supply section, and a control section configured to control operation of the focused ion beam apparatus, the method comprising:
   a temporally heating process of controlling an operation of the heater by the control section such that the emitter is temporarily heated to release the ion source gas from a surface of the emitter before the ion source gas is exchanged with the another ion source gas.

5. The focused ion beam apparatus according to claim 1, wherein the ion source gas comprises a nitrogen gas and/or a hydrogen gas.

6. The focused ion beam apparatus according to claim 1, wherein the ion source gases before and after the exchange comprise a nitrogen gas and a hydrogen gas, respectively.

7. The focused ion beam apparatus according to claim 1, wherein the temperature higher than the temperature at which each of the ion source gases before and after the exchange freezes is a temperature higher than 30K and less than or equal to 100K.

8. The method according to claim 2, wherein the operation of the cooling unit is controlled by a temperature controller of the control section.

9. The method according to claim 8, wherein the cooling unit is connected to the ion source chamber by a connecting section; and wherein the temperature controller controls the operation of the cooling unit to cool the emitter by cooling the connecting section and a wall portion of the ion source chamber.

10. The method according to claim 2, wherein the ion source gases before and after the exchange comprise a nitrogen gas and a hydrogen gas, respectively.

11. The method according to claim 2, wherein the temperature higher than the temperature at which each of the ion source gases before and after the exchange freezes is a temperature higher than 30K and less than or equal to 100K.

12. The method according to claim 2, wherein the operation of the cooling unit is controlled such that the temperature of the wall surface contacting the ion source in the ion source chamber is constantly maintained at a temperature higher than 30K and less than or equal to 100K.

13. The focused ion beam apparatus according to claim 3, wherein the heater is provided to a base portion of the emitter.

14. The focused ion beam apparatus according to claim 3, wherein the temperature control section controls the operation of the heater such that the emitter is temporarily heated to a setting temperature higher than the temperature at which each of the ion source gases before and after the exchange freezes and lower than a temperature of a tip of the emitter.

15. The focused ion beam apparatus according to claim 14, wherein the setting temperature is 200K.

16. The method according to claim 4, wherein the operation of the heater is controlled by a temperature controller of the control section.

17. The method according to claim 16, wherein the operation of the heater is controlled by the temperature controller such that the heater is temporarily heated to a setting temperature higher than the temperature at which each of the ion source gases before and after the exchange freezes and lower than a temperature of a tip of the emitter.

* * * * *